(12) United States Patent
Chambion et al.

(10) Patent No.: US 10,991,738 B2
(45) Date of Patent: Apr. 27, 2021

(54) METHOD FOR PRODUCING CURVED ELECTRONIC CIRCUITS

(71) Applicant: COMMISSARIAT A L'ENERGIE ATOMIQUE ET AUX ENERGIES ALTERNATIVES, Paris (FR)

(72) Inventors: Bertrand Chambion, Pontcharra (FR); Stephane Caplet, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/179,355

(22) Filed: Nov. 2, 2018

(65) Prior Publication Data

US 2019/0140008 A1 May 9, 2019

(30) Foreign Application Priority Data

Nov. 7, 2017 (FR) .................................... 17 60450

(51) Int. Cl.
*H01L 27/146* (2006.01)
*H01L 21/683* (2006.01)
(Continued)

(52) U.S. Cl.
CPC ........ *H01L 27/14625* (2013.01); *H01L 21/52* (2013.01); *H01L 21/6836* (2013.01);
(Continued)

(58) Field of Classification Search
None
See application file for complete search history.

(56) References Cited

U.S. PATENT DOCUMENTS 3,560,076 A * 2/1971 Ceppi ................... B29C 43/203
359/487.02
3,565,719 A * 2/1971 Webb ...................... B32B 15/14
156/212
(Continued)

FOREIGN PATENT DOCUMENTS

EP     2 320 469 A1    5/2011
JP     2005-191218    7/2005
(Continued)

OTHER PUBLICATIONS

French Preliminary Search Report dated Jun. 25, 2018 in French Application 17 60450, filed on Nov. 7, 2017 (with English Translation of Categories of Cited Documents).
(Continued)

*Primary Examiner* — David E Graybill
(74) *Attorney, Agent, or Firm* — Oblon, McClelland, Maier & Neustadt, L.L.P.

(57) ABSTRACT

A method for producing curved electronic circuits is provided, including placing adhesive elements between electronic chips and curved bearing surfaces, with the chips disposed between the surfaces and a flexible film, and such that the chips, the elements, and the surfaces are arranged in a single volume to be depressurised towards an environment outside the volume, the volume including empty spaces between the chips and the surfaces, the spaces being in fluid communication with each other within the volume; establishing a pressure difference between an inside and an outside of the volume such that the film applies a pressure on and collectively deforms the chips in accordance with the surfaces; and stopping the establishing of the pressure difference, the chips being collectively maintained against the surfaces by the elements such that a shape of each of the
(Continued)

chips conforms to a corresponding shape of each of the surfaces.

14 Claims, 6 Drawing Sheets

(51) Int. Cl.
    *H01L 21/52*     (2006.01)
    *H01L 51/00*     (2006.01)

(52) U.S. Cl.
    CPC .. *H01L 27/14618* (2013.01); *H01L 27/14634* (2013.01); *H01L 27/14683* (2013.01); *H01L 51/003* (2013.01); *H01L 2221/6834* (2013.01); *H01L 2221/68336* (2013.01)

(56) References Cited

U.S. PATENT DOCUMENTS

| | | | | |
|---|---|---|---|---|
| 4,686,321 A * | 8/1987 | Kishi | H01L 31/03921 | 136/244 |
| 5,729,423 A * | 3/1998 | Donde | H01L 21/6831 | 361/234 |
| 5,745,331 A * | 4/1998 | Shamouilian | H01L 21/6831 | 361/234 |
| 5,746,874 A * | 5/1998 | Natarajan | B32B 37/0023 | 156/285 |
| 5,753,132 A * | 5/1998 | Shamouilian | H01L 21/6831 | 216/33 |
| 5,801,915 A * | 9/1998 | Kholodenko | C23C 16/45521 | 361/234 |
| 5,880,777 A * | 3/1999 | Savoye | H04N 5/20 | 257/229 |
| 5,986,875 A * | 11/1999 | Donde | H01L 21/6831 | 361/234 |
| 6,179,951 B1 * | 1/2001 | Natarajan | B32B 37/0023 | 156/285 |
| 6,278,600 B1 * | 8/2001 | Shamouilian | H01L 21/6831 | 361/234 |
| 6,320,115 B1 * | 11/2001 | Kataoka | B32B 17/04 | 136/251 |
| 6,423,174 B1 * | 7/2002 | Casey | B32B 18/00 | 156/285 |
| 6,482,742 B1 * | 11/2002 | Chou | B29C 43/003 | 264/293 |
| 6,486,917 B2 * | 11/2002 | Iwasaki | H01L 27/14601 | 348/294 |
| 6,849,843 B2 * | 2/2005 | Ansorge | H01L 27/14603 | 250/208.1 |
| 6,975,016 B2 * | 12/2005 | Kellar | H01L 24/81 | 257/618 |
| 7,186,367 B2 * | 3/2007 | Hou | B29C 35/02 | 264/511 |
| 7,190,039 B2 * | 3/2007 | Boettiger | H01L 27/14601 | 257/432 |
| 7,390,687 B2 * | 6/2008 | Boettiger | H01L 27/14601 | 257/E27.13 |
| 7,397,066 B2 * | 7/2008 | Oliver | H01L 27/14618 | 257/113 |
| 7,696,588 B2 * | 4/2010 | Boettiger | H01L 27/14685 | 257/432 |
| 7,714,437 B2 * | 5/2010 | Naya | H01L 23/49816 | 257/737 |
| 7,923,793 B2 * | 4/2011 | Choi | H04N 5/2253 | 257/415 |
| 7,935,559 B1 * | 5/2011 | Giffard | H01L 27/14683 | 257/E21.189 |
| 8,064,139 B2 * | 11/2011 | Ando | B29D 11/00365 | 359/642 |
| 8,524,514 B2 * | 9/2013 | Lasfargues | H01L 23/49816 | 438/26 |
| 8,878,116 B2 * | 11/2014 | Itonaga | H04N 5/369 | 250/208.1 |
| 8,968,637 B2 * | 3/2015 | Krueger | B28B 1/00 | 264/607 |
| 9,349,763 B1 * | 5/2016 | Lin | H01L 27/14605 | |
| 9,490,285 B2 * | 11/2016 | Itonaga | H01L 27/14618 | |
| 9,570,488 B2 * | 2/2017 | McKnight | H01L 27/14607 | |
| 9,691,634 B2 * | 6/2017 | Koelling | H01L 23/49827 | |
| 9,859,314 B2 * | 1/2018 | McKnight | H01L 27/14607 | |
| 9,870,927 B2 * | 1/2018 | Keefe | H01L 21/304 | |
| 9,942,454 B2 * | 4/2018 | Watanabe | H04N 5/23296 | |
| 10,014,262 B2 * | 7/2018 | Klingbeil | H01L 23/4827 | |
| 10,017,033 B2 * | 7/2018 | Fisher | B32B 17/10137 | |
| 10,020,347 B2 * | 7/2018 | Enoki | H01L 27/307 | |
| 10,062,727 B2 * | 8/2018 | McKnight | H01L 27/14683 | |
| 10,157,957 B2 * | 12/2018 | Yamamoto | H01L 27/14627 | |
| 10,304,880 B2 * | 5/2019 | Kim | H04N 5/3696 | |
| 10,304,900 B2 * | 5/2019 | Keefe | H01L 27/14698 | |
| 10,361,235 B2 * | 7/2019 | Yang | | |
| 10,373,995 B2 * | 8/2019 | Guenter | H04N 5/3696 | |
| 2001/0040639 A1 * | 11/2001 | Iwasaki | H01L 27/14601 | 348/374 |
| 2002/0177319 A1 * | 11/2002 | Chou | B82Y 10/00 | 438/690 |
| 2003/0148596 A1 * | 8/2003 | Kellar | H01L 21/743 | 438/612 |
| 2005/0035514 A1 * | 2/2005 | Hillman | H01L 21/6838 | 269/21 |
| 2005/0140033 A1 * | 6/2005 | Jiang | B29D 11/0073 | 264/1.7 |
| 2006/0038183 A1 | 2/2006 | Oliver | | |
| 2006/0186492 A1 * | 8/2006 | Boettiger | H01L 27/14601 | 257/414 |
| 2006/0275941 A1 * | 12/2006 | Oliver | H01L 27/14618 | 438/57 |
| 2007/0096235 A1 * | 5/2007 | Boettiger | H01L 27/14601 | 257/434 |
| 2008/0237443 A1 * | 10/2008 | Oliver | H01L 27/14618 | 250/200 |
| 2009/0045510 A1 | 2/2009 | Naya | | |
| 2009/0115875 A1 * | 5/2009 | Choi | H01L 27/14618 | 348/294 |
| 2010/0202060 A1 * | 8/2010 | Ando | B29D 11/00365 | 359/642 |
| 2010/0236705 A1 * | 9/2010 | Chou | B82Y 40/00 | 156/273.7 |
| 2011/0149423 A1 | 6/2011 | Lasfargues et al. | | |
| 2012/0147207 A1 * | 6/2012 | Itonaga | H01L 27/14618 | 348/222.1 |
| 2012/0217606 A1 * | 8/2012 | Itonaga | H01L 31/0203 | 257/443 |
| 2012/0261551 A1 * | 10/2012 | Rogers | G02B 3/14 | 250/208.1 |
| 2012/0299140 A1 * | 11/2012 | Sekine | H01L 27/14607 | 257/432 |
| 2014/0041714 A1 * | 2/2014 | Van Den Berg | B29C 70/088 | 136/251 |
| 2014/0049683 A1 * | 2/2014 | Guenter | H04N 5/262 | 348/360 |
| 2014/0160327 A1 | 6/2014 | Enoki et al. | | |
| 2015/0008459 A1 * | 1/2015 | Wei | H01L 33/0095 | 257/89 |
| 2015/0118784 A1 * | 4/2015 | Gerber | H01L 27/1469 | 438/67 |
| 2015/0334300 A1 * | 11/2015 | Gabriel | H04N 5/247 | 348/218.1 |
| 2016/0086987 A1 * | 3/2016 | McKnight | H01L 27/14607 | 257/432 |
| 2016/0086994 A1 * | 3/2016 | Guenter | H01L 27/14625 | 250/206 |
| 2016/0240582 A1 | 8/2016 | Yamamoto et al. | | |
| 2016/0286102 A1 * | 9/2016 | Sulfridge | H04N 5/2253 | |
| 2016/0293429 A1 * | 10/2016 | Keefe | H01L 21/304 | |
| 2016/0293451 A1 * | 10/2016 | Koelling | H01L 27/12 | |
| 2017/0008377 A1 * | 1/2017 | Fisher | B32B 17/10036 | |
| 2017/0117311 A1 * | 4/2017 | McKnight | H01L 27/14687 | |
| 2017/0301585 A1 * | 10/2017 | Koelling | B22F 3/093 | |
| 2017/0358537 A1 * | 12/2017 | Klingbeil | H01L 23/4827 | |

(56) References Cited

U.S. PATENT DOCUMENTS

| | | | |
|---|---|---|---|
| 2018/0076257 A1* | 3/2018 | McKnight | H01L 27/14683 |
| 2019/0006401 A1* | 1/2019 | Kim | H01L 27/14607 |
| 2019/0140008 A1* | 5/2019 | Chambion | H01L 27/14625 |

FOREIGN PATENT DOCUMENTS

| | | | |
|---|---|---|---|
| JP | 2005-260043 | | 9/2005 |
| JP | 2005260436 | * | 9/2005 |
| JP | 2015-192074 | | 11/2015 |
| WO | WO 2012/172251 A1 | | 12/2012 |
| WO | WO-2015146332 A1 * | 10/2015 | H04N 5/2253 |
| WO | WO 2016/161223 A1 | | 10/2016 |

OTHER PUBLICATIONS

Chambion, B., et al., "Tunable curvature of large visible CMOS image sensors: Towards new optical functions and system miniaturization", 2016 IEEE 66$^{th}$ Electronic Components and Technology Conference (ECTC), pp. 1-10.

* cited by examiner

//  METHOD FOR PRODUCING CURVED ELECTRONIC CIRCUITS

TECHNICAL FIELD AND PRIOR ART

The invention relates to the production of several curved, that is to say non-flat, electronic circuits and to the production of electronic devices comprising such curved electronic circuits coupled to optical systems, for example of imager (or sensor) or display unit type. The invention relates to the collective production of several curved electronic circuits.

An electronic device such as a sensor or a display unit comprises an optical system, generally formed of several lenses, coupled to an electronic circuit intended to produce an emission or a detection of light through the optical system. The electronic circuit comprises a substrate on which are produced several electronic components forming an electronic chip.

The fact of bending the electronic circuit is one solution that makes it possible to greatly simplify the optical system, notably by reducing the number of lenses required by the optical system, which enables a more compact production of the optical system. An example of simplification of a wide angle optic is described for example in the document "Tunable curvature of large visible CMOS image sensors: Towards new optical functions and system miniaturization" of B. Chambion et al., 2016 IEEE 66th Electronic Components and Technology Conference (ECTC).

The substrates from which the electronic components of circuits are produced are generally made of silicon. Packaging techniques and methods make it possible to reduce the thickness of the substrate down to relatively small thicknesses (several microns). To produce a curved electronic circuit, once the substrate of the components of the circuit has been thinned to the desired thickness, the electronic circuit is packaged, or assembled, on a support which is compatible with the desired curvature.

In the previously cited document of B. Chambion et al., a particular support is described on which the electronic circuit is bonded. The curvature is next obtained by applying on one point a force against the support, at the centre of the side opposite to that where the electronic circuit is located. In this method, it is however necessary that the force bending the support is constantly applied on the support, which represents an important constraint.

The document US 2014/0160327 A1 describes the use of a support in which is formed a cavity. An electronic circuit is arranged on the support, above the cavity. The circuit is next curved under the effect of a thermal treatment. The curvature may be adjusted via a depressurising of the cavity, and the circuit is next fixed in the curved position obtained through a glue injected between the circuit and the support in the cavity. This solution has however the drawback of causing considerable mechanical stresses at the edges of the electronic circuit that rest on the support, which weakens it. In addition, this method has the drawback of not controlling the final shape of the curved circuit obtained in the cavity.

Alternatively, the document WO 2012/172251 A1 describes the production of a curved electronic circuit making use of a support formed of two materials having different coefficients of thermal expansion. The curvature is obtained by a bimetal effect between the two materials of the support which have different thermomechanical behaviours. This method is not however suited to a collective production of several curved electronic circuits since the different electronic circuits produced from a same substrate have to be cut before each being arranged individually on a support. In addition, the choice of the level of curvature of the circuits is made by adjustment of the temperature to which the support is subjected, which is restrictive notably when the electronic circuit corresponds to an imager due to the fact that its operation is extremely temperature sensitive (an increase in the temperature carried out to adjust the curvature of the circuit degrades the quality of the image supplied by the imager on account of the increase in noise caused by the increase in the temperature).

The documents US 2011/0149423 A1, US 2009/0045510 A1 and EP 2 320 469 A1 describe other methods making it possible to bend electronic circuits. However, none of these methods is suited for collectively producing several curved electronic circuits.

The document US 2006/0038183 A1 describes a method making it possible to bend collectively several electronic circuits produced on a same substrate. To do so, a compartment containing a fluid is positioned under each circuit in such a way as to apply a hydrostatic force under each circuit. The curvature of the circuits is obtained through this hydrostatic force. This method has however several drawbacks. Indeed, the curvature obtained varies with the temperature to which the fluid is subjected. It is thus difficult to obtain a precise curvature of the electronic circuits. In addition, this solution is not reliable because, in the event of leakage of the fluid, the curvature of the circuits has to be readjusted.

DESCRIPTION OF THE INVENTION

Thus there is a need to propose a method for collectively producing several curved electronic circuits that does not have the drawbacks of the methods of the prior art described previously.

To do so, a method is described for producing at least one curved electronic circuit, including:
  putting in place at least one adhesive element between at least one electronic chip and at least one curved bearing surface, with the electronic chip arranged between the curved bearing surface and a flexible film, and such that the electronic chip, the adhesive element and the curved bearing surface are arranged in a volume able to be depressurised towards the environment outside the volume;
  establishing a pressure difference between the inside and the outside of the volume such that the flexible film applies a pressure on the electronic chip deforming it in accordance with the curved bearing surface;
  stopping the application of the pressure difference between the inside and the outside of the volume, the curved electronic chip being maintained against the curved bearing surface by the adhesive element.

It is notably proposed a method for collectively producing several curved electronic circuits, including:
  putting in place several adhesive elements between several electronic chips and several curved bearing surfaces, with the electronic chips arranged between the curved bearing surfaces and a flexible film, and such that the electronic chips, the adhesive elements and the curved bearing surfaces are arranged in a single volume able to be depressurised towards the environment outside the volume and including empty spaces present between the electronic chips and the curved bearing surfaces;
  establishing a pressure difference between the inside and the outside of the volume such that the flexible film applies a pressure on the electronic chips deforming them in accordance with the curved bearing surfaces;

stopping the application of the pressure difference between the inside and the outside of the volume, the curved electronic chips being maintained against the curved bearing surfaces by the adhesive elements.

In this method, due to the fact that the force is applied by pressure against one of the main faces of the electronic chip(s) and not at the sides, or lateral faces, thereof, a similar deformation may be obtained simultaneously for several electronic chips, which makes the method compatible with a collective production of several curved electronic circuits. A collective production of several curved electronic circuits is also possible due to the fact that it is not necessary to arrange individually each electronic chip on a distinct support to bend the electronic chips.

Moreover, this method does not use materials having different CET (coefficients of thermal expansion) to obtain the desired curvature by bimetal effect, which makes the curvature of the electronic circuit(s) independent of the temperature to which the electronic circuit(s) is subjected. The curvature obtained is also more stable thanks to the fact that the bearing surface used is curved and defines the curvature of the electronic circuit produced. Finally, the curvature of the electronic circuit(s) is not impacted by a high temperature to which the electronic circuit(s) could be subjected.

In addition, unlike the method described in the document US 2014/0160327 A1 wherein the edges of the curved electronic chip rest on the edges of the support, the edges of the curved electronic chip by the method disclosed here are free and the mechanical stresses undergone by the electronic chip during its curvature are well spread out in the whole of the chip. Without embedding, the edges of the electronic chip are thus not subjected to greater local stresses than in the remainder of the chip.

This method does not make use of a fluid to obtain the desired curvature, which increases the reliability of the method.

This method is compatible with a concave or convex curvature of the electronic chip of the curved electronic circuit produced. Other curvature shapes may also be envisaged, such as for example: elliptical, portion of torus, free form. Any curvature shape may be envisaged, provided that said curvature does not cause mechanical breakage of the electronic chip.

The electronic chips, the adhesive elements and the curved bearing surfaces are arranged in a single volume able to be depressurised towards the environment outside the volume and including empty spaces present between the electronic chips and the curved bearing surfaces, that is to say a single space in which air can circulate freely in all the parts of this space. Air can notably circulate freely in the empty spaces present between the electronic chips and the curved bearing surfaces and between these empty spaces. Several distinct volumes do not form together a single volume as defined above.

Advantageously, the establishment of the pressure difference between the inside and the outside of the volume may comprise the establishment of a vacuum inside the volume.

The flexible film corresponds to a thin layer able to be deformed under the effect of the pressure difference and to constrain the electronic chip along the curved bearing surface.

The flexible film may form at least one part of the walls delimiting the volume able to be depressurised. In an alternative, the flexible film may be included in the volume able to be depressurised towards the outside environment, notably when the volume is delimited by at least one flexible wall able to bear on the flexible film during the depressurising of the volume.

Before the establishment of the pressure difference between the inside and the outside of the volume, the curved bearing surface may be arranged between the electronic chip and a rigid support, the volume being formed at least by the rigid support and the flexible film made integral with the rigid support, the pressure difference between the inside and the outside of the volume being produced through at least one opening passing through the rigid support and/or pores of the material of the rigid support.

Before the establishment of the pressure difference between the inside and the outside of the volume, the curved bearing surfaces may be arranged between the electronic chips and a rigid support, the volume being able to be formed at least by the rigid support and the flexible film made integral with the rigid support, the pressure difference between the inside and the outside of the volume being able to be produced through at least one opening passing through the rigid support and/or pores of the material of the rigid support.

The method may further comprise, after stopping the application of the pressure difference between the inside and the outside of the volume, a step of removal of the rigid support.

Alternatively, the volume may be delimited by a flexible wall. This flexible wall has for example a pouch, or bag, shape in which are arranged the electronic chip(s), the element(s) forming the curved bearing surfaces, the adhesive element(s) and the flexible film.

The method may further comprise, before the establishment of the pressure difference between the inside and the outside of the volume, putting in place a counter-wedge such that the electronic chip is arranged between the curved bearing surface and the counter-wedge, the counter-wedge being able to have a curved surface arranged against the electronic chip during the establishment of the pressure difference between the inside and the outside of the volume. On the establishment of the pressure difference between the inside and the outside of the volume, the curved surface of the counter-wedge thus bears on the electronic chip, thereby contributing to the bending of the electronic chip.

The method may further comprise, before the establishment of the pressure difference between the inside and the outside of the volume, putting in place counter-wedges such that the electronic chips are arranged between the curved bearing surfaces and the counter-wedge(s), and the counter-wedges may have curved surfaces arranged against the electronic chips during the establishment of the pressure difference between the inside and the outside of the volume.

The curved bearing surface may correspond to a surface of a wedge or to an inner surface of a package in which the electronic chip is intended to be encapsulated. The curved bearing surfaces may correspond to surfaces of wedges or to inner surfaces of packages in which the electronic chips are intended to be encapsulated.

Several curved electronic circuits may be produced collectively from several electronic chips maintained against several curved bearing surfaces.

In this case, several wedges that are distinct and spaced apart or not from each other, or several packages that are distinct and spaced apart or not from each other, may be used to form the curved bearing surfaces. Thus, during the establishment of the pressure difference one or several exhaust channels formed between the wedges or packages make it possible to have a circulation of air inside the volume. Alternatively or additionally, this circulation of air may be obtained thanks to a notch present in the volume, at the periphery of the volume, for example formed in the rigid support.

When the electronic chips are produced against the flexible film, the method may further comprise, before the putting in place step, a stretching, isotropic or not, of the flexible film causing a spacing apart of the electronic chips from each other, the flexible film being maintained stretched during the putting in place step.

The electronic chips may be produced against the flexible film via the implementation of the following steps:
  making the flexible film integral against a semiconductor substrate, on the side of electronic components produced on the semiconductor substrate and intended to form the electronic chips;
  cutting the semiconductor substrate, forming the electronic chips.

In this case, between the steps of making integral and cutting, the substrate may undergo a step of thinning.

In an alternative, when the electronic chip(s) are not produced against the flexible film, the electronic chip(s) may be arranged against the curved bearing surface(s) in a unitary manner.

The element(s) forming the curved bearing surfaces may be integral with the rigid support.

In an alternative, the putting in place step may comprise:
  making the flexible film integral against a temporary support such that the flexible film is arranged between the electronic chip(s) and the temporary support;
  an arrangement of the curved bearing surface(s) facing the electronic chip(s);
  an arrangement of a rigid support such that it forms, with the flexible film, said volume;
  a removal of the temporary support.

The adhesive element(s) may be arranged against the electronic chip(s) and/or against the curved bearing surface(s).

A method is also proposed for producing at least one electronic device, comprising the implementation of a method for producing at least one electronic circuit such as described above, then a step of optical coupling of the electronic circuit with an optical system, forming the electronic device.

It is also proposed a method for producing at least one electronic device, comprising the implementation of a method for producing electronic circuits as described above, then a step of optical coupling of at least one of the electronic circuits with an optical system, forming the electronic device.

BRIEF DESCRIPTION OF THE DRAWINGS

The present invention will be better understood on reading the description of exemplary embodiments given purely for indicative purposes and in no way limiting, while referring to the appended drawings in which.

Identical, similar or equivalent parts of the different figures described hereafter bear the same numerical references in order to make it easier to go from one figure to the next.

The different parts shown in the figures are not necessarily according to a uniform scale, in order to make the figures more legible.

The different possibilities (alternatives and embodiments) should be understood as not being mutually exclusive and may be combined together.

DETAILED DESCRIPTION OF PARTICULAR EMBODIMENTS

FIGS. 1A to 1J show the steps of a method for producing at least one curved electronic circuit 100, according to a first embodiment. In this first embodiment, several electronic circuits 100 corresponding to CMOS imagers are produced. In an alternative, the electronic circuit(s) 100 may correspond to CCD imagers or any other electronic circuit.

Figure 1A:
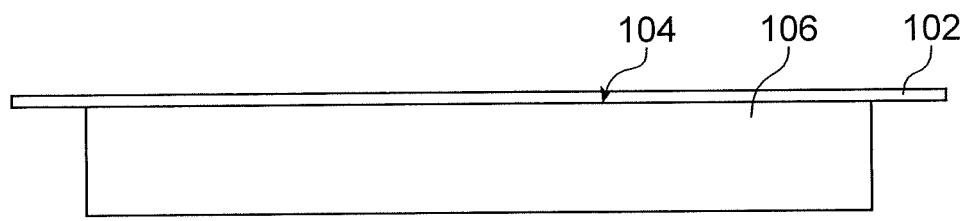
FIGS. 1A to 1J show the steps of a method for producing at least one curved electronic circuit according to a first embodiment.

In the course of a first step shown in FIG. 1A, a flexible film 102 is made integral with a first face 104 of a semiconductor substrate 106. This film 102 is intended to protect the electronic chips that will be produced from the substrate 106, to support and handle these electronic chips, and to contribute to the bending of these electronic chips implemented in the course of the method.

The electronic components of the electronic circuits 100 are produced beforehand on the semiconductor substrate 106 and are located on the side of the first face 104 which corresponds to the front face of the substrate 106. These electronic components form for example image sensors.

The flexible film 102 is characterised by its aptitude to be able to be stretched without breaking. The elongation at break of the flexible film 102 is at least 1%, and preferably greater than around 10%. The elongation at break of the flexible film 102 may be even greater, and reach for example around 500%.

The flexible film 102 may comprise compounds of the family of polyolefins and/or the family of polysiloxanes. As other examples, the film 102 may correspond to a film of Adwill® D-650, D-675 or E-8180HR type, sold by the Lintec® Company.

The nature of the flexible film 102 is notably chosen as a function of the stretching that said flexible film 102 has to undergo to bend the electronic chips. Thus, the smaller the radius of curvature to reach and/or the smaller the electronic chips, the more the flexible film 102 must have considerable stretchability.

The flexible film 102 is moreover leak tight.

The lengthening that the film 102 may undergo may be reversible or not. Thus, the flexible film 102 may have elastic properties. In the first embodiment described here, the film 102 comprises at least one elastic material that will make it possible, in the course of the method, to be stretched and to space apart the electronic chips that will be produced from the substrate 106.

The film 102 comprises a thickness for example comprised between around 50 µm and 100 µm, or between around 50 µm and 200 µm.

The substrate 106 may comprise at least one semiconductor material. In the first embodiment described here, the substrate 106 corresponds to a silicon wafer. The thickness of the substrate 106 corresponds to the standard thickness of a silicon wafer, for example equal to around 725 µm.

Figure 1B:
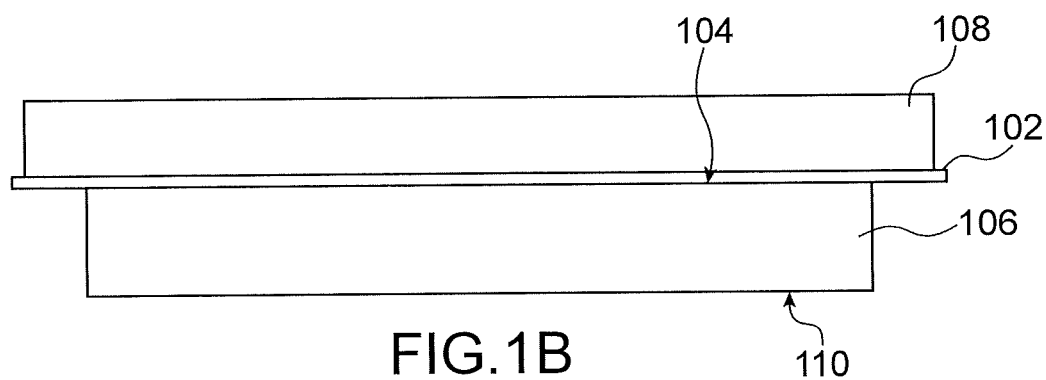

Optionally, the substrate 106 may undergo thinning. To do so, a temporary support 108 is made integral with the film 102, on the side opposite to that in contact with the substrate 106 (FIG. 1B).

Figure 1C:
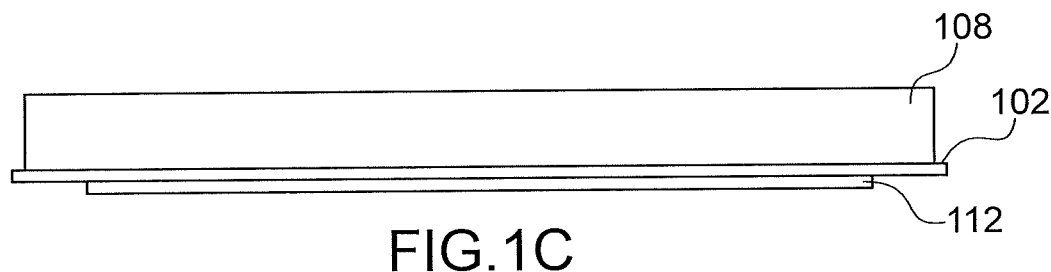

The substrate 106 is next thinned from a second face 110, opposite to the first face 104, until a layer 112 is obtained formed by the remaining part of the substrate 106 and of which the thickness corresponds to the desired semiconductor thickness, for example around 100 µm (FIG. 1C). This thinning is for example carried out by successively implementing a first rough grinding in order to remove rapidly an important part of the substrate 106, then a second fine grinding making to possible to slim down the remaining thickness of the material of the substrate 106, then a chemical mechanical planarization (CMP) or a dry etching or any other method making it possible to remove the worked zone of the substrate 106. The thickness of the layer 112 is for example less than around 400 µm, and typically less than around 100 µm. This thinning may also be implemented such that the thickness of the layer 112 is several microns, for example less than or equal to around 10 µm. When the substrate 106 comprises a stop layer including for example $SiO_2$ and arranged between a superficial layer in which the electronic components are produced and a support layer, the thinning may be carried out such that the support layer is completely eliminated. This is the case when the substrate 106 is a SOI substrate.

The thinning of the substrate 106 described above is optional, and it is possible to continue the method with a non-thinned substrate 106, notably when the substrate 106 is intended to form a single and very large electronic chip.

Figure 1D:
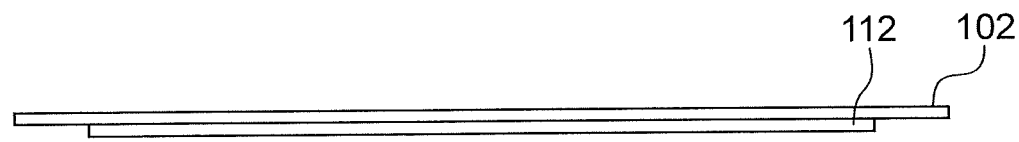

The temporary support 108 is next removed (FIG. 1D).

Figure 1E:
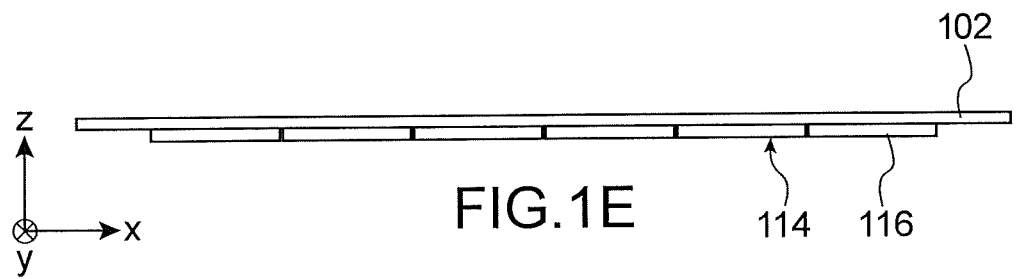

The layer 112 is next cut into the form of electronic chips 116 each intended to form one of the electronic circuits 100 (FIG. 1E). The electronic chips 116 have lateral dimensions (parallel to the interface between the layer 112 and the film 102, or instead parallel to the plane (X,Y) shown in FIG. 1E) dependent on the envisaged application. This cutting step is implemented from one face 114 of the layer 112, opposite to the face 104. When the layer 112 is transparent to infrared rays, such as for example when the layer 112 comprises silicon, the localisation of the cutting paths may be done by infrared imaging through the layer 112 due to the fact that the front face 104 is not accessible by imaging in the visible domain.

Figure 1F:
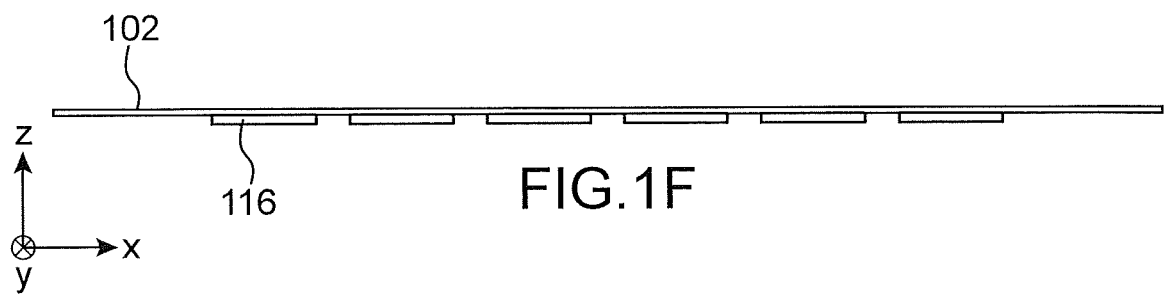

As shown in FIG. 1F, the film 102 is next stretched along one or more directions lying in the main plane of the film 102, that is to say parallel to the interfaces between the film 102 and the electronic chips 116 (parallel to the plane (X,Y)), in order to space the electronic chips 116 apart from each other and next to carry out a direct transfer of the electronic chips 116 and the film 102 onto the desired supports.

Figure 1G:
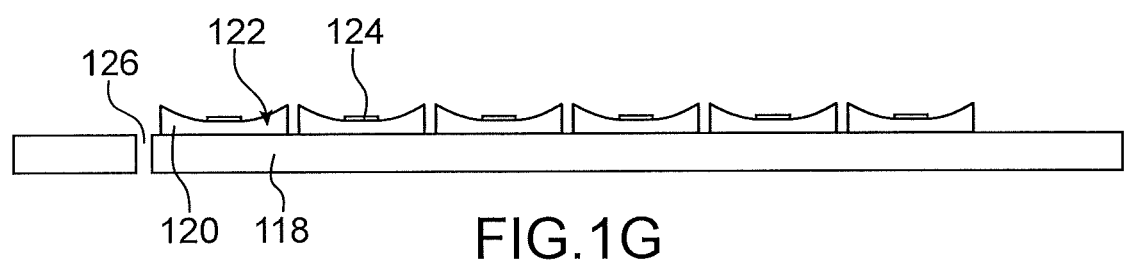

In this first embodiment, the electronic chips 116 are intended to be transferred collectively onto a support 118 on which are arranged wedges 120 (see the exemplary embodiment shown in FIG. 1G). The support 118 is here rigid. Each of the wedges 120 comprises a curved bearing surface 122 on which one of the electronic chips 116 is intended to be transferred and made integral (for example bonded). The curved bearing surface 122 of each wedge 120 has dimensions greater than or equal to those of each of the electronic chips 116. An adhesive element 124, for example glue, is arranged on the curved bearing surface 122 of each of the wedges 120. The wedges 120 are for example produced by moulding, machining or 3D printing, or instead correspond to portions of ceramic intended to form part of the final encapsulation structures of the electronic circuits 100. The wedges 120 may also be monolithic, for example made of machined metal, or moulded polymer and forming a matrix of QFN (Quad Flat package No leads) packages. The spaces present between the wedges 120 make it possible to have a circulation of air between them. It is also possible to have at least one groove formed in the support 118, on the side of the wedges 120, to enable a circulation of air.

In an alternative, it is possible to have a single wedge 120 comprising several curved bearing surfaces 122 on which the different electronic chips 116 are intended to be transferred.

The support 118 also comprises one or several openings 126 passing through the support 118, placing in communication the two main faces of the support 118.

Figure 1H:
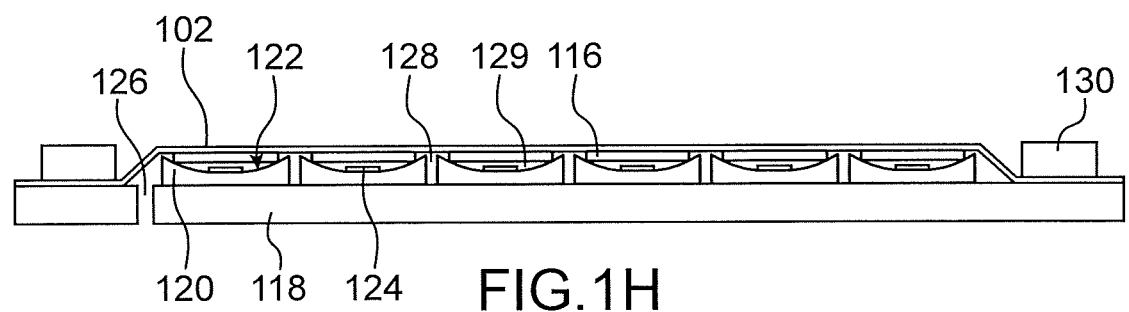

As shown in FIG. 1H, the assembly formed of the film 102 and the electronic chips 116 is transferred onto the support 118, on the side of the wedges 120. Each of the electronic chips 116 is arranged against the curved bearing surface 122 of one of the wedges 120. The edges of the film 102 are made integral in a leak tight manner with the support 118 in order that the film 102 and the support 118 form a volume 128 in which the electronic chips 116, the wedges 120 and the adhesive elements 124 are enclosed. This volume 128 communicates with the outside environment uniquely through the opening(s) 126. In the exemplary embodiment shown in FIG. 1H, the edges of the film 102 are made integral with the support 118 thanks to a ring 130 pinning in a leak tight manner the edges of the film 102 to the support 118. The volume 128 includes empty spaces 129 present between the electronic chips 116 and the curved bearing surfaces 122 of the wedges 120. These empty spaces 129 communicate with each other and with the remainder of the volume 128 due to the fact that the electronic chips 116 are not bearing on the curved bearing surfaces 122 on the whole periphery of their edge. This is for example the case when each electronic chip 116 has a rectangular parallelepiped shape and when the curved bearing surfaces 122 of the wedges 120 are concave and for example spherical or cylindrical.

Figure 1I:
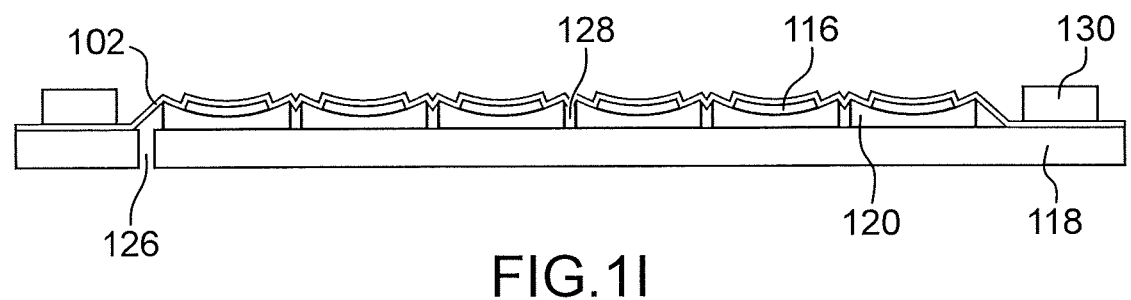

In order to bend the electronic chips 116, a pressure difference is established between the two sides of the film 102, that is to say here between the inside of the volume 128 and the side of the film 102 opposite to that where the electronic chips 116 are located. In this first embodiment, a vacuum, for example a primary vacuum (pressure comprised between around 1 and $10^{-3}$ mbars), is created in the volume 128 through the opening 126. The creation of this pressure difference causes a pinning of the film 102 against the curved bearing surfaces 122 of the wedges 120. The electronic chips 116 are pinned against these curved bearing surfaces 122 of the wedges 120 and conform their shape on account of the hydrostatic force applied by the film 102, thanks to the negative pressure created within the volume 128 (FIG. 1I).

It is also possible that this hydrostatic force is brought about by an overpressure created on the side of the film 102 opposite to that where the electronic chips 116 are found, this overpressure replacing the negative pressure in the volume 128 or being complementary to this negative pressure.

When the adhesive elements 124 correspond to portions of glue, this glue is then cross-linked, either at room temperature, or by implementing a thermal cycle, making it possible to make the electronic chips 116 integral with the curved bearing surfaces 122 of the wedges 120 and thereby maintain the electronic chips 116 according to this curved shape. The implementation of a thermal cycle to cross-link the glue further facilitates the bending of the electronic chips 116 due to the fact that the rise in temperature fluidifies the glue and softens the film 102, favouring the pinning of the electronic chips 116 on the curved bearing surfaces 122.

Figure 1J:
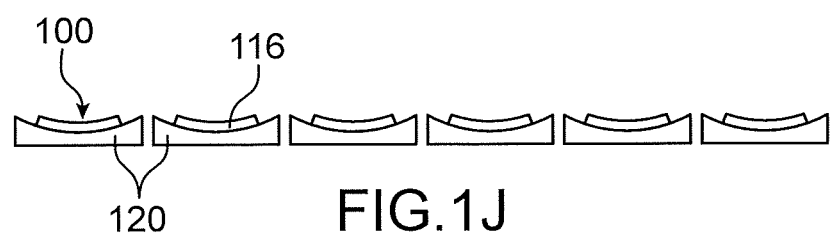

Once the glue has been cross-linked, the return to the air is carried out by stopping the pressure difference created on each side of the film 102. The film 102 is removed, for example by UV treatment or by peeling. In the case of a monolithic matrix of wedges 120, a cutting step is implemented in order to separate one by one the electronic circuits 100 each produced and formed of a curved electronic chip 116 and the associated wedge 120. The wedges 120 may also be dissociated from the rigid support 118 (FIG. 1J).

At the end of these steps, the electronic circuits 100 may be packaged individually. Input and output electrical contacts connected to the electronic chips 116 may also be produced.

In the first embodiment described previously, the adhesive elements 124 are arranged on the curved bearing surfaces 122 of the wedges 120 in order to make the electronic chips 116 integral with the wedges 120. In an alternative, the adhesive elements 124 may be deposited on the electronic chips 116, for example by screen printing when the adhesive elements 124 are portions of glue, or any other rear face deposition technique.

In addition, in the first embodiment described above, the film 102 is stretched before making the electronic chips 116 integral with the wedges 120, in order to space the electronic chips 116 apart from each other.

In an alternative, it is possible not to stretch the film 102 because the implementation or not of this step of stretching the film 102 depends on the desired dimensions and spacings of the wedges 120 and electronic chips 116. In this alternative, the wedges 120 are arranged one beside the other while touching each other, due to the fact that the electronic chips 116 are not spaced apart from each other before the assembly formed of the film 102 and the electronic chips 116 is transferred onto the support 118, on the side of the wedges 120. The electronic chips 116 are however cut before their positioning on the wedges 120. The edges of the wedges 120 are positioned in the cutting lines present between neighbouring electronic chips 116.

In this alternative in which the electronic circuits 100 are produced collectively, the wedges 120 are advantageously formed by a single monolithic element, for example a semiconductor wafer, in which the curved bearing surfaces 122 are produced for example by lithography. Next, a pressure difference is established between the two sides of the film 102 so that the electronic chips 116 are pinned against the curved bearing surfaces 122 of the wedges 120 and conform their shape, as described previously.

Figure 7:
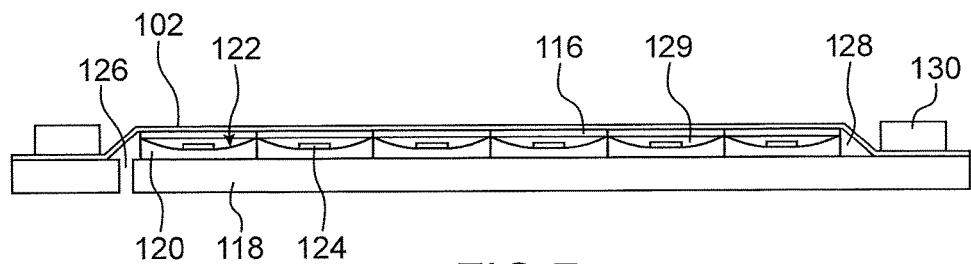
FIG. 7 shows a structure obtained in the course of the implementation of the production method according to an alternative of the first embodiment.

FIG. 7 shows the configuration obtained according to this alternative of the first embodiment, before the establishment of the pressure difference between the inside and the outside of the volume 128. The volume 128 notably includes the empty spaces 129 present between the electronic chips 116 and the curved bearing surfaces 122 and which communicate with each other in the volume 128.

The method according to this alternative is finished as described previously in relation with FIG. 1J.

In this alternative, the fact that the film 102 is not stretched before the positioning of the electronic chips 116 on the curved bearing surfaces 122 makes it possible to conserve the relative positioning of the wedges 120 and the chips 116 with respect to each other, which guarantees, at the end of bonding, very good alignment of each of the electronic chips 116 in the wedge 120 that is associated therewith. This is highly advantageous, for example to produce an alignment with respect to an optical system.

Moreover, in the first embodiment described above, the curved bearing surfaces 122 of the different wedges 120 are similar to each other. For example, for an electronic chip 116 of lateral dimensions equal to 30 mm×37 mm and a thickness equal to 0.1 mm, the radius of curvature R of the curved bearing surface 122 onto which this electronic chip 116 is transferred may be such that R=150 mm. In an alternative, it is possible that these curved bearing surfaces 122 have different radiuses of curvature, or instead that certain wedges 120 do not have a curved surface but a flat surface. Generally, the radius of curvature R is for example comprised between around 1 mm and 5000 mm.

In an alternative of the opening(s) 126 serving to place under vacuum the volume 128 in which are located the wedges 120 and the electronic chips 116, it is possible to use a porous support 118, for example a substrate including ceramic, for example alumina or silicon carbide.

Moreover, the shapes of the curved surfaces 122 of the wedges 120 may be concave or convex, spherical, cylindrical, a portion of torus shape, or instead of free or aspherical shape.

FIGS. 2A to 2D show a part of the steps of a method for producing curved electronic circuits 100, according to a second embodiment. This second embodiment is advantageously implemented when the curved bearing surfaces 122 are convex.

Figure 2A:
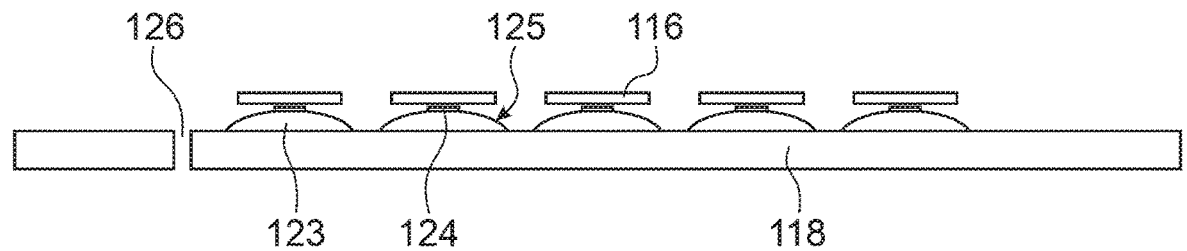
FIGS. 2A to 2D show a part of the steps of a method for producing at least one curved electronic circuit according to a second embodiment.
Figure 2B:
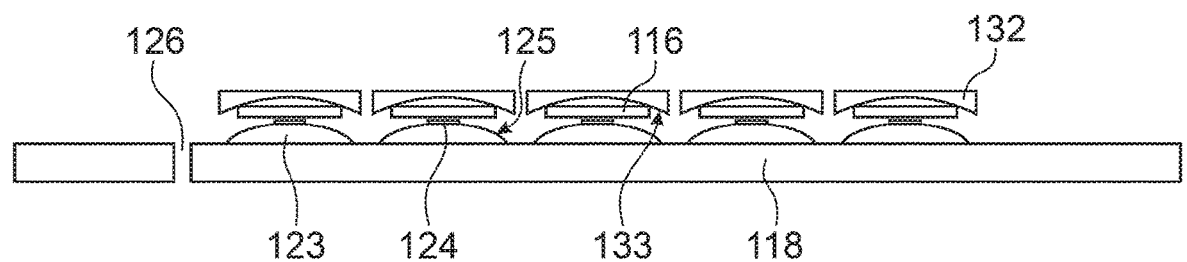

As shown in FIG. 2A, the support 118 is formed, the wedges 123 being present on a front face of the support 118. The curved bearing surfaces 125 are here convex. The electronic chips 116 are arranged individually on the curved bearing surfaces 125 of the wedges 123, the adhesive means 124 being interposed between the electronic chips 116 and the curved bearing surfaces 125.

Counter-wedges 132, forming complementary bearing elements to the surfaces 125, are arranged on the electronic chips 116. Each of the counter-wedges 132 has a surface in contact with one of the electronic chips 116 which is for example of shape complementary to that of the curved bearing surface 125 of the associated wedge 123. Thus, in the example of FIG. 2B, the curved bearing surface 125 has a convex shape and the counter-wedge 132 has a bearing surface (in contact with the electronic chip 116) forming a concave curved surface 133.

In the second embodiment described here, the radius of curvature of the bearing surface 133 of the counter-wedge 132 is greater than or equal to that of the curved bearing surface 125. If the counter-wedge 132 has a convex bearing surface 133, with a wedge 123 such as described previously in relation with the first embodiment, the radius of curvature of the bearing surface 133 of the counter-wedge 132 is less than or equal to that of the curved bearing surface 125.

However, if the material of the counter-wedge 132 has a certain flexibility, the difference between the radiuses of curvature of the surfaces 125 and 133 may be greater than when the material of the counter-wedge 132 is rigid because a flexible counter-wedge 132 more easily conforms the shape of the wedge 123.

In the second embodiment described here, the counter-wedges 132 are arranged individually on the electronic chips 116.

Figure 2C:
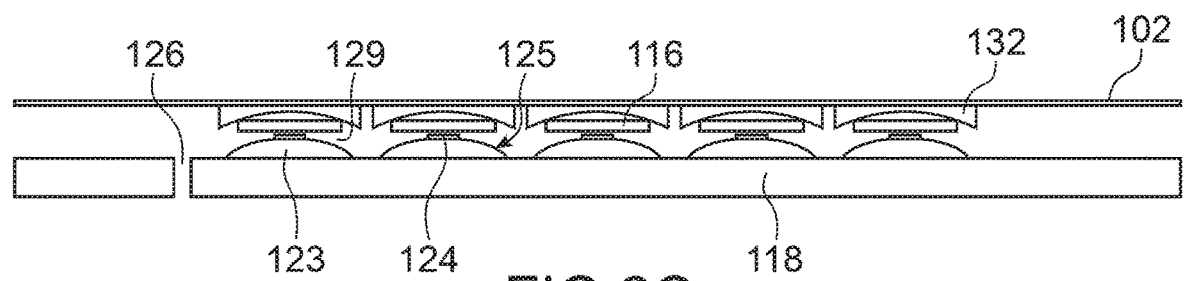

As shown in FIG. 2C, the film 102 is arranged on the counter-wedges 132.

Figure 2D:
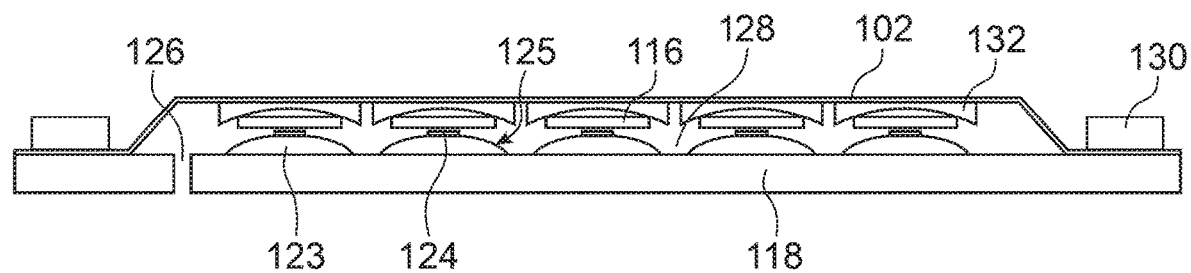

As in the first embodiment, the edges of the film 102 are next made integral with the rigid support 118 in a leak tight manner in order that the film 102 and the rigid support 118 form the volume 128 in which the electronic chips 116, the wedges 123, the adhesive elements 124 and the counter-wedges 132 are enclosed (FIG. 2D). This volume 128 communicates with the outside environment uniquely through the opening(s) 126. As in the first embodiment, the edges of the film 102 are made integral with the rigid support 118 thanks to the ring 130 pinning the edges of the film 102 to the rigid support 118 in a leak tight manner. The empty spaces 129 present between the electronic chips 116 and the curved bearing surfaces 125 communicate with each other in the volume 128.

The method for producing electronic circuits 100 is next finished in an analogous manner to the first embodiment described previously, that is to say by placing the volume 128 under vacuum in order to pin and bend the electronic chips 116 against the wedges 123 (using the pressure exerted by the film 102 and the counter-wedges 132 on the electronic chips 116), by cross-linking the glue of the adhesive elements 124, by stopping the depressurising of the volume 128, by carrying out the unitary cutting of the electronic circuits 100 and by packaging them.

The alternative embodiments of the method for producing electronic circuits 100 described previously in relation with the first embodiment may apply to the second embodiment described above.

In an alternative of the second embodiment, it is notably possible that the wedges 123 are arranged one beside the other such that two neighbouring wedges touch each other. The wedges 123 are advantageously formed by a single monolithic element, for example a semiconductor wafer. Neighbouring counter-wedges 132 may also be in contact with each other. The electronic chips 116 are cut before their positioning on the wedges 123. A pressure difference is established between the two sides of the film 102 so that the electronic chips 116 are pinned against the curved bearing surfaces 125 of the wedges 123 and conform their shape, as described previously.

The method according to this alternative is finished as described previously in relation with FIGS. 2C and 2D.

Moreover, in an alternative of the second embodiment, the counter-wedges 132 and/or the electronic chips 116 may be transferred onto the wedges 123 not individually as in the method described above, but collectively by making the counter-wedges 132 and/or the electronic chips 116 integral with the film 102 beforehand and by using the film 102 to carry out his transfer.

In an alternative, it is also possible not to use counter-wedges 132 to bend the electronic chips 116. In this case, as in the first embodiment, the bearing bending the electronic chips 116 against the curved surfaces 125 of the wedges 123 is produced directly by the film 102.

FIGS. 3A to 3D show a part of the steps of a method for producing curved electronic circuits 100, according to a third embodiment.

Figure 3A:
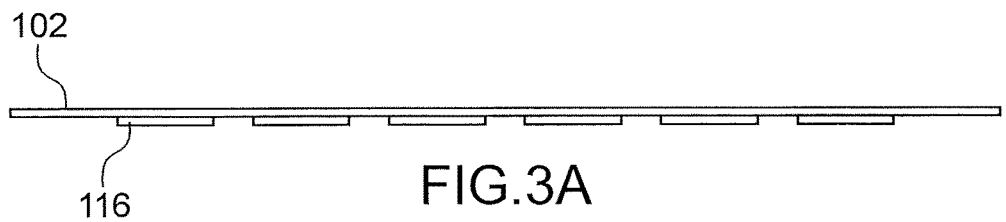
FIGS. 3A to 3D show a part of the steps of a method for producing at least one curved electronic circuit according to a third embodiment.

The steps described previously in relation with FIGS. 1A to 1F are firstly implemented, thereby producing the electronic chips 116 on the film 102, which may be stretched (FIG. 3A).

Figure 3B:
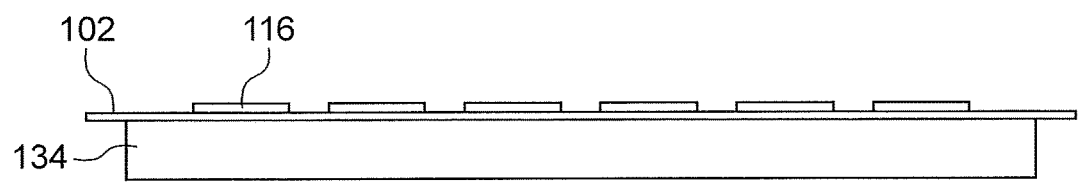

As shown in FIG. 3B, the film 102 is next turned over and made integral on a temporary support 134 (different from the temporary support 108 described previously in relation with the first embodiment).

Figure 3C:
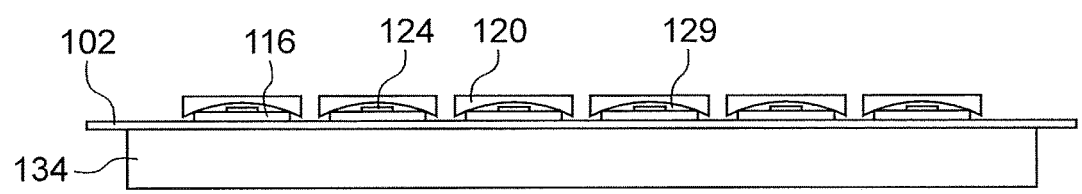
Figure 3D:
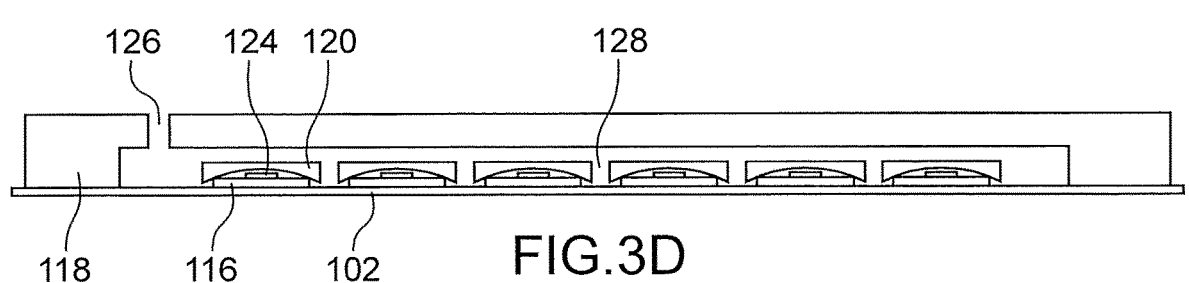

The adhesive elements 124 and the wedges 120 are next arranged on the electronic chips 116 (FIG. 3C).

The rigid support 118 is next transferred onto the film 102, thereby forming the volume 128 that will be depressurised to bend the electronic chips 116 via the bearing undergone by the electronic chips 116 and the wedges 120 between the film 102 and the rigid support 118. By transferring the rigid support 118 onto the film 102, one benefits from the adherence of the front face of the film 102 to facilitate the transfer and the leak tightness with the rigid support 118. The temporary support 134 may be removed at this stage of the method.

The method is next finished as in the preceding embodiments, that is to say by placing the volume 128 under vacuum in order to pin and bend the electronic chips 116 against the wedges 120, by cross-linking the glue of the adhesive elements 124, by stopping the depressurising of the volume 128, by carrying out the unitary cutting of the electronic circuits 100 and by placing them in final packages.

In an alternative, it is possible that the film 102 is not stretched before the positioning of the film 102 on the temporary support 134. In this case, the wedges 120 next positioned on the electronic chips 116 are such that neighbouring wedges 120 touch each other, as described previously in relation with FIG. 7. The method according to this alternative is finished as described above.

Whatever the embodiment of the method producing the electronic circuits 100, the alignment between the wedges 120 and the electronic chips 116 (which corresponds to the steps described in relation with FIGS. 1H, 2B and 3C) is for example carried out with a precision of the order of 0.1 mm, and preferably 10 m.

In the examples described previously, the depressurising of the volume 128 is obtained by producing a primary vacuum in the volume 128. Generally, the vacuum level is adjusted in order to ensure good pinning of the electronic chips 116 against the wedges 120, and to obtain the desired curvature of the electronic chips 116.

In the method described previously according to the different embodiments, several electronic circuits 100 are produced collectively, and the electronic chips 116 are notably curved in a collective manner in the course of this method. In an alternative, this method may be implemented for a single electronic circuit 100, in the course of which the curvature of a single electronic chip 116 may be carried out.

In the embodiments described previously, the wedges 120 are distinct from the rigid support 118. In an alternative, it is possible that the wedges 120 correspond to projecting parts of the rigid support 118. The wedges 120 may further correspond to a single element including several curved surfaces 122.

Finally, in the different embodiments described previously, the force applied by the film 102 on the electronic chips 116 to deform them is brought about by placing the volume 128 under vacuum. In an alternative, it is possible that this force applied by the film 102 on the electronic chips 116 is brought about by an increase in the pressure outside the volume 128.

Figure 4:
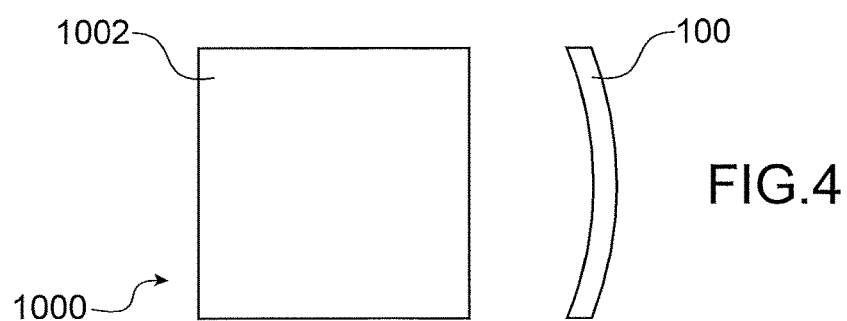
FIG. 4 shows an electronic device produced with a curved electronic circuit obtained by the implementation of a production method according to one of the embodiments.

In all cases, the curved electronic circuits 100 thereby produced may be used for the production of electronic devices 1000 such as that shown schematically in FIG. 4. In this figure, the electronic device 1000 corresponds to an imager including a curved electronic circuit 100 forming an image sensor optically coupled to an optical system 1002 including several lenses focusing light received on the electronic components of the circuit 100.

In the embodiments described previously, each curved electronic circuit 100 formed of an electronic chip 116 bonded to a curved bearing surface 122 of a wedge 120 is packaged at the end of the steps described above. According to an alternative that can apply to all the embodiments described previously, it is possible that the wedges 120 correspond to the encapsulation packages of the electronic chips 116. In this case, the flexible film 102 ensures the closing of the package. Each of these encapsulation packages or each part of the flexible film 102 enclosing one of the packages is provided with a vent, or opening, in order that, during the application of the pressure difference between the inside and the outside of the volume 128, the air present in the package can be evacuated.

In an alternative of the embodiments described previously, it is possible that the flexible film 102 surrounds the assemblies formed of the wedges 120 (or packages) and the electronic chips 116, a part of the flexible film 102 passing between the rigid support 118 and the wedges 120. According to another alternative, it is possible that the flexible film 102 surrounds the assemblies formed of the wedges 120 and the electronic chips 116 and also the rigid support 118.

Figure 5:
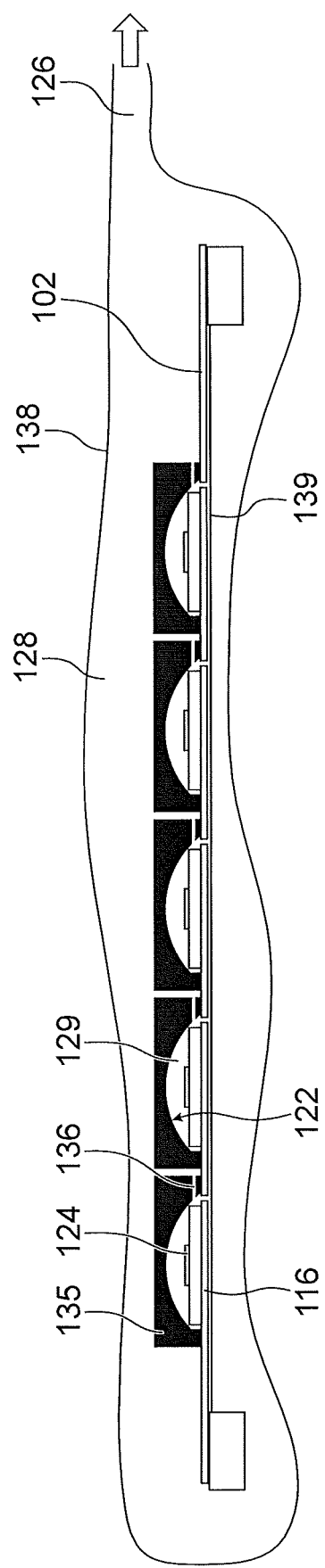
FIGS. 5 and 6 show alternative embodiments of a method for producing at least one curved electronic circuit.

According to a fourth embodiment, it is possible not to use a rigid support 118. For example, as shown in FIG. 5, the electronic chips 116 are produced on the flexible film 102. In this fourth embodiment, the curved bearing surfaces 122 correspond to the inner surfaces of packages 135 in which the electronic chips 116 are intended to be encapsulated. The reference 136 designates a vent formed in each of these packages 135 making it possible to evacuate the air present between the electronic chips and the curved bearing surfaces 122. The assembly is arranged in the volume 128 delimited by flexible walls, here formed by a flexible pouch 138. The opening 126 is used to establish the pressure difference between the inside and the outside of the volume 128. The walls of the flexible pouch 138 then bear on the flexible film 102 which, in deforming, pin the electronic chips 116 against the curved bearing surfaces 122 of the packages 135. The inside of each package 135 in which is located one of the electronic chips 116 is closed by the flexible film 102 which adheres to the edges of the packages 135. When the vents are formed in the flexible film 102, an air permeable film 139 covers the flexible film 102 in order that during the application of the pressure difference between the inside and the outside of the volume 128, the flexible pouch 138 does not close the vents.

Figure 8:
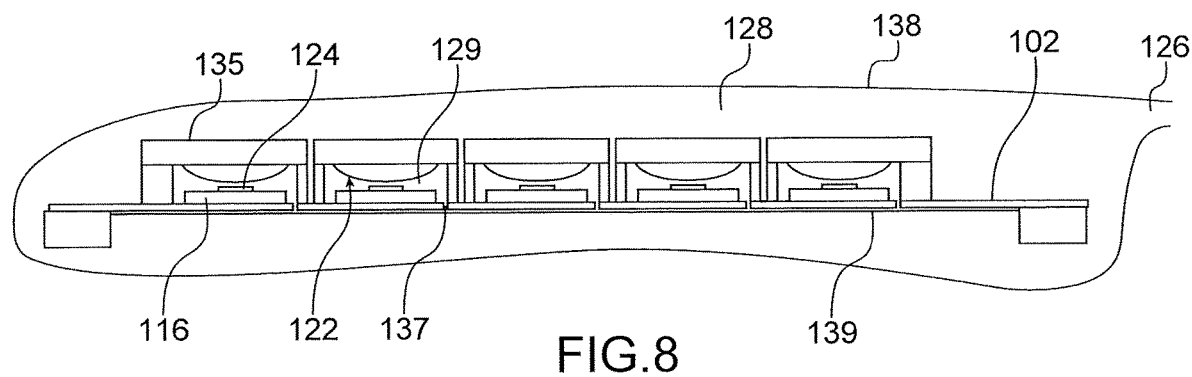
FIG. 8 shows a structure obtained in the course of the implementation of the production method according to another alternative embodiment.

In an alternative of this fourth embodiment, the packages 135 may not comprise the vents 136, as is the case in FIG. 8. In this case, during the depressurising of the volume 128, air is evacuated through the vents 137 formed through the flexible film 102. Moreover, in the example shown in FIG. 8, the bearing surfaces 122 are convex. In this alternative, the packages 135 may be in contact one beside the other and be formed for example in the form of a single monolithic piece that will be cut following the making integral of the electronic chips 116.

If the electronic chips 116 are intended to be encapsulated between the wedges 120, or the packages 135, and the flexible film 102, the flexible film 102 has adhesive properties enabling it to adhere to the edges of the wedges 120 or packages 135, and thereby encapsulate the electronic chips 116 pinned against the curved bearing surfaces 122. It is thereby possible to place the wedges 120 or the packages 135 by a "pick and place" type method, on the flexible film 102 already stretched, which improves the alignment of the electronic chips 116 towards the wedges 120 or packages 135. This may also apply to the third embodiment described previously.

Figure 6:
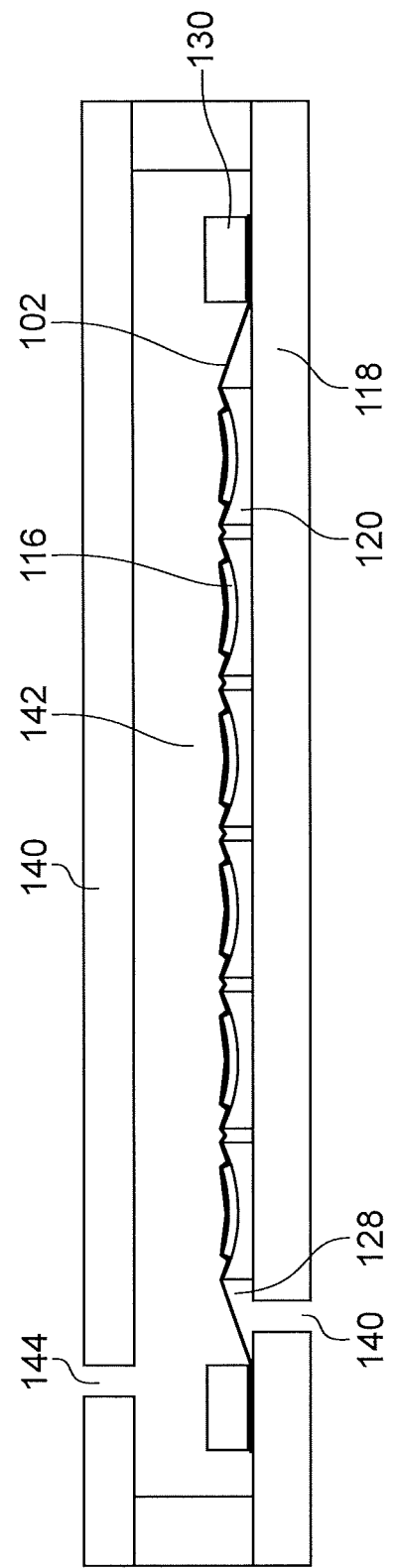

FIG. 6 shows another alternative embodiment in which a cover 140 is made integral with the rigid support 118 in order to form a volume 142 being able to be pressurised via an opening 144 formed through the cover 140, thereby increasing the possible pressure difference between the inside and the outside of the volume 128, which makes it possible to better pin the electronic chips 116 against the curved surfaces 122 of the wedges 120.

Figure 9:
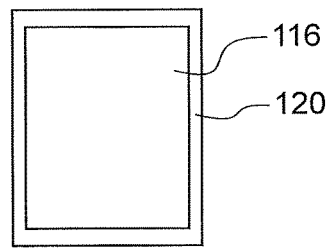
FIG. 9 shows a top view of an electronic chip arranged on a curved bearing surface.

In all the embodiments, the implementation of the method for collectively producing several electronic circuits 100 makes it possible to use wedges 120 of dimensions close to and slightly greater than those of the electronic chips 116. FIG. 9 shows a top view of an electronic chip 116 arranged on a wedge 120 (it is to be noted that the curvature of the bearing surface 122, not visible in this FIG. 9, is for example spherical).

The invention claimed is:

1. A method for producing several curved electronic circuits, comprising:
   placing several adhesive elements between several electronic chips and several curved bearing surfaces, with the several electronic chips disposed between the several curved bearing surfaces and a flexible film, and such that the several electronic chips, the several adhesive elements, and the several curved bearing surfaces are arranged in a single volume configured to be depressurised towards an environment outside the single volume, wherein the single volume includes empty spaces present between the several electronic chips and the several curved bearing surfaces, the empty spaces being in fluid communication with each other within the single volume;
   before establishing a pressure difference between an inside and an outside of the single volume, disposing the several curved bearing surfaces between the several electronic chips and a rigid support, the flexible film being attached to the rigid support;
   establishing the pressure difference between the inside and the outside of the single volume such that the flexible film applies a pressure on the several electronic chips, and collectively deforms the several electronic chips in accordance with the several curved bearing surfaces; and
   stopping the establishing of the pressure difference between the inside and the outside of the single volume, the several electronic chips being collectively maintained against the several curved bearing surfaces by the several adhesive elements such that a shape of each of the several electronic chips conforms to a corresponding shape of each of the several curved bearing surfaces,
   wherein the single volume is defined at least by the rigid support and the flexible film.

2. The method according to claim 1, wherein the establishing the pressure difference between the inside and the outside of the single volume comprises establishing a vacuum inside the single volume.

3. The method according to claim 1, wherein, the pressure difference between the inside and the outside of the single volume is produced through at least one opening passing through the rigid support and/or through pores of a material of the rigid support.

4. The method according to claim 3, further comprising, after stopping the establishing the pressure difference between the inside and the outside of the single volume, a step of removing the rigid support.

5. The method according to claim 1, comprising placing each of said electronic chips in contact with a respective one of the curved bearing surfaces before establishing the pressure difference.

6. The method according to claim 1, further comprising, before the establishing the pressure difference between the inside and the outside of the single volume, putting in place counter-wedges such that the several electronic chips are disposed between the several curved bearing surfaces and the counter-wedges, wherein the counter-wedges have curved surfaces disposed against the several electronic chips during the establishing the pressure difference between the inside and the outside of the single volume.

7. The method according to claim 6, wherein a shape of each of the several curved bearing surfaces corresponds to a shape of surfaces of the counter-wedges or to a shape of inner surfaces of electronic chip encapsulation packages.

8. The method according to claim 1, wherein the several electronic chips are produced in contact with the flexible film via implementation of the following steps:
    attaching the flexible film against a semiconductor substrate, on a side of the semiconductor substrate used for forming the several electronic chips; and
    cutting the semiconductor substrate, thereby forming the electronic chips.

9. The method according to claim 1, wherein the placing the several adhesive elements step comprises:
    attaching the flexible film against a temporary support such that the flexible film is disposed between the several electronic chips and the temporary support;
    arranging the several curved bearing surfaces facing the several electronic chips;
    arranging a rigid support so as to form, with the flexible film, the single volume; and
    removing the temporary support.

10. The method according to claim 1, wherein the several adhesive elements are disposed against the several electronic chips and/or against the several curved bearing surfaces.

11. A method for producing at least one electronic device, comprising implementation of a method for producing several curved electronic circuits according to claim 1; and then a step of optical coupling of at least one of the several curved electronic circuits with an optical system, thereby foil ling the at least one electronic device.

12. The method according to claim 5, wherein placing each of said electronic chips in contact with a respective one of the curved bearing surfaces comprises forming an opening defined by an edge of each electronic chip and the respective curved bearing surface, the method further comprising evacuating the empty spaces through respective ones of the openings.

13. The method according to claim 6, wherein the counter wedges each have a curved surface, the method comprising:
    placing each of said electronic chips in contact with a respective one of the curved surfaces of the counter-wedges, forming an opening between an edge of each electronic chip and the respective curved surfaces of the counter-wedges and forming respective second empty spaces between the electronic chips and the curved surfaces of the counter-wedges; and
    evacuating the second empty spaces through respective ones of the openings.

14. A method for producing several curved electronic circuits, comprising:
    placing several adhesive elements between several electronic chips and several curved bearing surfaces, with the several electronic chips disposed between the several curved bearing surfaces and a flexible film, and such that the several electronic chips, the several adhesive elements, and the several curved bearing surfaces are arranged in a single volume configured to be depressurised towards an environment outside the single volume, wherein the single volume includes empty spaces present between the several electronic chips and the several curved bearing surfaces, the empty spaces being in fluid communication with each other within the single volume;
    establishing a pressure difference between an inside and an outside of the single volume such that the flexible film applies a pressure on the several electronic chips, and collectively deforms the several electronic chips in accordance with the several curved bearing surfaces; and
    stopping the establishing of the pressure difference between the inside and the outside of the single volume, the several electronic chips being collectively maintained against the several curved bearing surfaces by the several adhesive elements such that a shape of each of the several electronic chips conforms to a corresponding shape of each of the several curved bearing surfaces,
    wherein the single volume is delimited by a flexible wall.

* * * * *